United States Patent
Bogan

(10) Patent No.: US 6,826,436 B1
(45) Date of Patent: Nov. 30, 2004

(54) METHOD AND APPARATUS FOR GRAPHING MOTION OF COMPUTER AIDED DESIGN (CAD) GEOMETRY

(75) Inventor: William E. Bogan, Lakeside, CA (US)

(73) Assignee: Autodesk, Inc., San Rafael, CA (US)

( * ) Notice: Subject to any disclaimer, the term of this patent is extended or adjusted under 35 U.S.C. 154(b) by 234 days.

(21) Appl. No.: 09/843,321

(22) Filed: Apr. 25, 2001

(51) Int. Cl.[7] .............................................. G06F 19/00
(52) U.S. Cl. ................................ 700/98; 703/1; 703/6; 703/7; 703/8
(58) Field of Search .......................... 700/98, 103, 180, 700/181; 703/1, 6, 7, 8; 382/293, 296; 345/649, 474, 458, 473

(56) References Cited

U.S. PATENT DOCUMENTS 5,835,693 A * 11/1998 Lynch et al. ................ 345/473
5,892,849 A * 4/1999 Chun et al. ................. 382/236
6,243,096 B1 * 6/2001 Takanashi ................... 345/419

* cited by examiner

*Primary Examiner*—Albert W. Paladini
*Assistant Examiner*—Carlos R. Ortiz Rodriguez
(74) *Attorney, Agent, or Firm*—Fish & Richardson P.C.

(57) ABSTRACT

The invention includes computer instructions that operate to receive a selection of a center of motion for an assembly of computer aided design (CAD) models of a mechanical design and a selection of a component of the assembly associated with the selected center of motion. Once the selections are received, a range of motion for the component is determined. Then, the computer instructions operate to receive a selection of an origin for a grid pattern, where the grid pattern is automatically generated based upon the determined range of motion. This automatically generated grid pattern is automatically displayed at the selected origin. In one embodiment, the computer instructions are part of a mechanical design software application. In one embodiment, the mechanical software application including the computer instructions is embodied in a distribution storage medium.

35 Claims, 9 Drawing Sheets

FIGURE 7

| | | 700 |
|---|---|---|
| 710 → | A Min. digging distance | XXXX mm (XX' XX") |
| 711 → | B Max. digging reach | XXXX mm (XX' XX") |
| 712 → | C Level crowding distance | XXXX mm (XX' XX") |
| 713 → | D Max. digging depth | XXXX mm (XX' XX") |
| 714 → | Crowding force | XXX kN (XX XXX kgf, XXX XXX lbf) |
| 715 → | Breakout force | XXX kN (XX XXX kgf, XXX XXX lbf) |

METHOD AND APPARATUS FOR GRAPHING MOTION OF COMPUTER AIDED DESIGN (CAD) GEOMETRY

FIELD OF INVENTION

The invention relates to the field of computer aided design (CAD). More specifically, the invention relates to graphing motion of CAD geometry.

BACKGROUND OF THE INVENTION

Computer aided design (CAD) programs have allowed users to design various parts in "virtual" space before the parts ever reach a manufacturing stage. As CAD programs have become more powerful, parts modeled in "virtual" space (i.e., CAD models) have become more true to life. For example, a complex machine, such as, a loader, (commonly seen loading and moving material with its bucket attached to the front) can now be fully designed and assembled in "virtual" space as CAD models, down to the smallest details.

Because of the costs associated with manufacturing complex machines, engineering design information regarding such machines is important to ascertain before manufacturing begins. Examples of engineering design information may include information regarding motion of the machine, loads and stresses on such components during the operation of the machine, and so forth. In order to determine these types of engineering design information, often times it is important to determine the motion of the machine and its components. For instance, angles and ranges of motion can affect the design information of the machine, i.e., stresses and forces experienced by the machine and its components.

Determining the motion of a machine often times involves extensive geometry calculations on numerous components of the machine. Such calculations can be very time consuming and difficult as the complexity of the motion of the components increases, when, for instance, the motion is not restricted to a single plane but includes motion both up and down and side to side.

Once the geometry calculations are completed, the motion of the machines is often charted/graphed manually to visually represent the calculated motion. However, the charted/ graphed motion is only as good as the calculations. That is, a manual charting/graphing of extensive geometry calculations is prone to error. Finally, once the motion of the machine is charted/graphed, engineering design information is manually calculated by ascertaining information from the manually charted/graphed motion. Each of these manual steps is time consuming and prone to error due to the extensive calculations.

BRIEF DESCRIPTION OF DRAWINGS

The invention is illustrated by way of example and not by way of limitation in the figures of the accompanying drawings, in which the like references indicate similar elements and in which:

FIG. 7 illustrates exemplary engineering design information determined from the automatic charting/graphing motion of CAD models practicing one embodiment of the invention;

DETAILED DESCRIPTION OF THE INVENTION

In the following description, various aspects of the invention will be described. However, it will be apparent to those skilled in the art that the invention may be practiced with only some or all described aspects. For purposes of explanation, specific numbers, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system, and the term computer system includes general purpose as well as special purpose data processing machines, systems, and the like, that are standalone, adjunct or embedded.

Various operations will be described as multiple discrete steps in turn, in a manner that is most helpful in understanding the invention. However, the order of description should not be construed as to imply that these operations are necessarily order dependent. In particular, these operations need not be performed in the order of presentation.

In various embodiments of the invention, an improved way of charting/graphing motion of CAD models is facilitated. Additionally, from the charted/graphed motion, engineering design information may be determined. These and other advantages will be evident from the disclosure.

Figure 1:
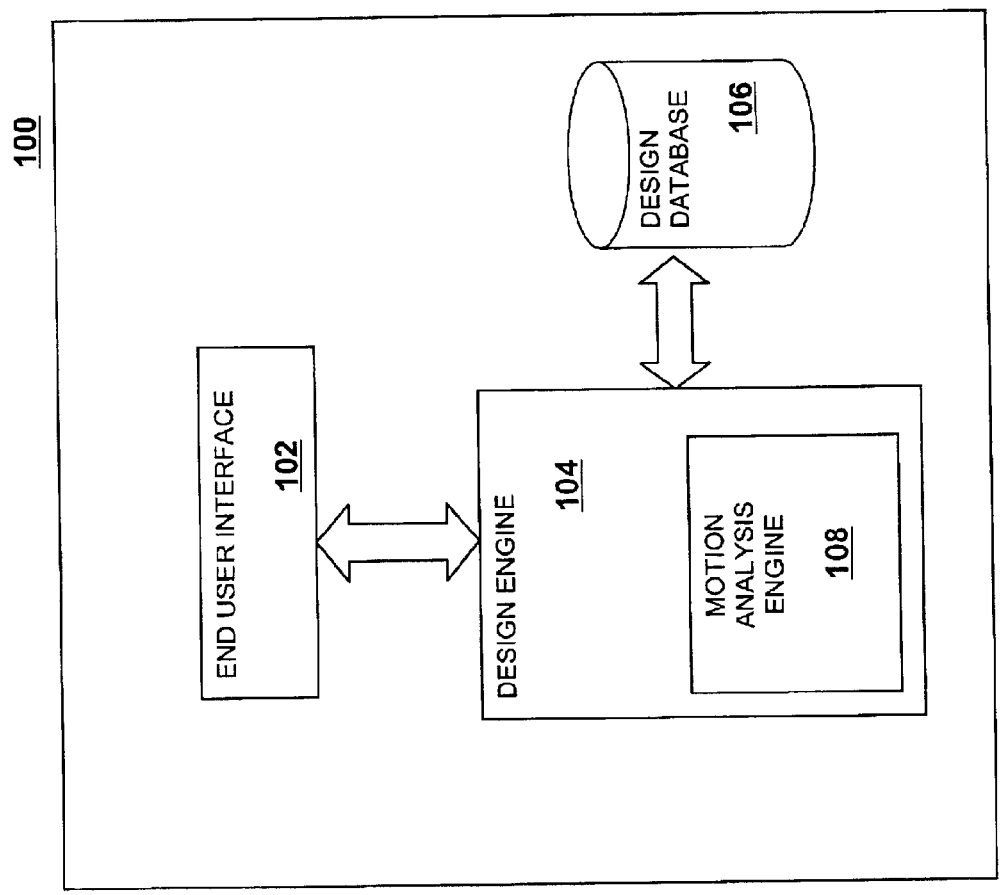
FIG. 1 illustrates a block diagram of one embodiment of a mechanical design application for facilitating charting/ graphing motion of CAD models, in accordance with one embodiment of the invention.

FIG. 1 illustrates a block diagram of one embodiment of a mechanical design application for facilitating charting/ graphing of motion of CAD models, in accordance with the invention. In FIG. 1, mechanical design application 100 includes an end user interface 102, a design engine 104, and a design database 106. The design engine 104 includes, in particular, a motion determination engine 108, in accordance with the invention. Together, the elements cooperate to facilitate charting/graphing of motion of CAD models, and, from the charted/graphed motion, determining of engineering design information.

In FIG. 1, the end user interface 102 operates to graphically display and receive input, from a user, of CAD models under the control of the design engine 104. Also under the control of the design engine 104, the design database 106 operates to store CAD model information for determining motions of various components of the CAD model. In particular, the motion determination engine 108 utilize various inputs to automatically chart/graph motion of CAD models, and, from the charted/graphed motion, determine engineering design information. Except for the teachings of the invention incorporated in the motion determination engine 108, the mechanical design application 100 is intended to represent a broad range of CAD software known in the art, including but not limited to Autodesk Inventor™, available from Autodesk, Inc. of San Rafael, Calif.

Figure 2A:
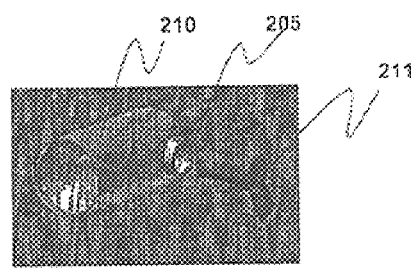
FIGS. 2A–2C illustrate an exemplar-simplified assembly of CAD models of a mechanical design with corresponding constraint menus showing constraints for the assembly.
Figure 2B:
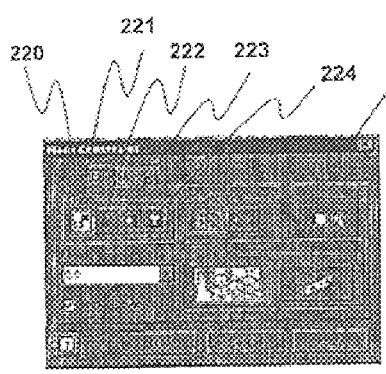
Figure 2C:
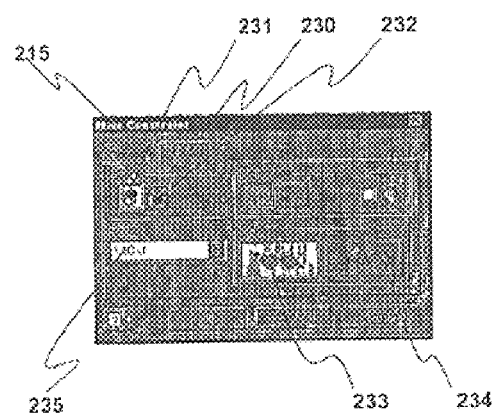

FIGS. 2A–2C illustrate an exemplar-simplified assembly of CAD models of a mechanical design with corresponding constraint menus showing constraints for the assembly. In FIG. 2A, a first CAD model, a body 210, is assembled with a second CAD model, a handle 211. As shown in FIG. 2A, the handle 211 is aligned with the body 210, in particular, a handle hole 205 in the body 210. As the two models 210 and 211 are assembled together, a user (not shown) inputs constraints for the assembly.

Constraints define relationships among CAD models making up an assembly. For example, as shown in FIG. 2B, a constraint menu 215 may include an assembly constraint tab 220 having constraints such as, but not limited to, mate 221, angle 222, tangent 223, and insert 224. These assembly constraints 221–224 define positions of the CAD models in the assembly relative to each other. Also included in the constraint menu 215 is a motion constraint tab 230 having constraints, such as, but not limited to, rotation 231, rotation/translation 232, forward motion 233, reverse motion 234, and limits of the motion 235.

For the example shown in FIG. 2A, the constraints 221–224 and 231–235 may be selected to define the position and motion of the handle 211 relative to the body 210 about the handle hole 205. Since the motion and position of the handle may be defined from its position in the handle hole 205, in particular, along an axis of the handle hole 205, the handle hole 205 may be defined as a center of motion for this assembly. Once the user inputs all of these constraints, these constraints may be stored in the design database 106 of FIG. 1.

Figure 3:
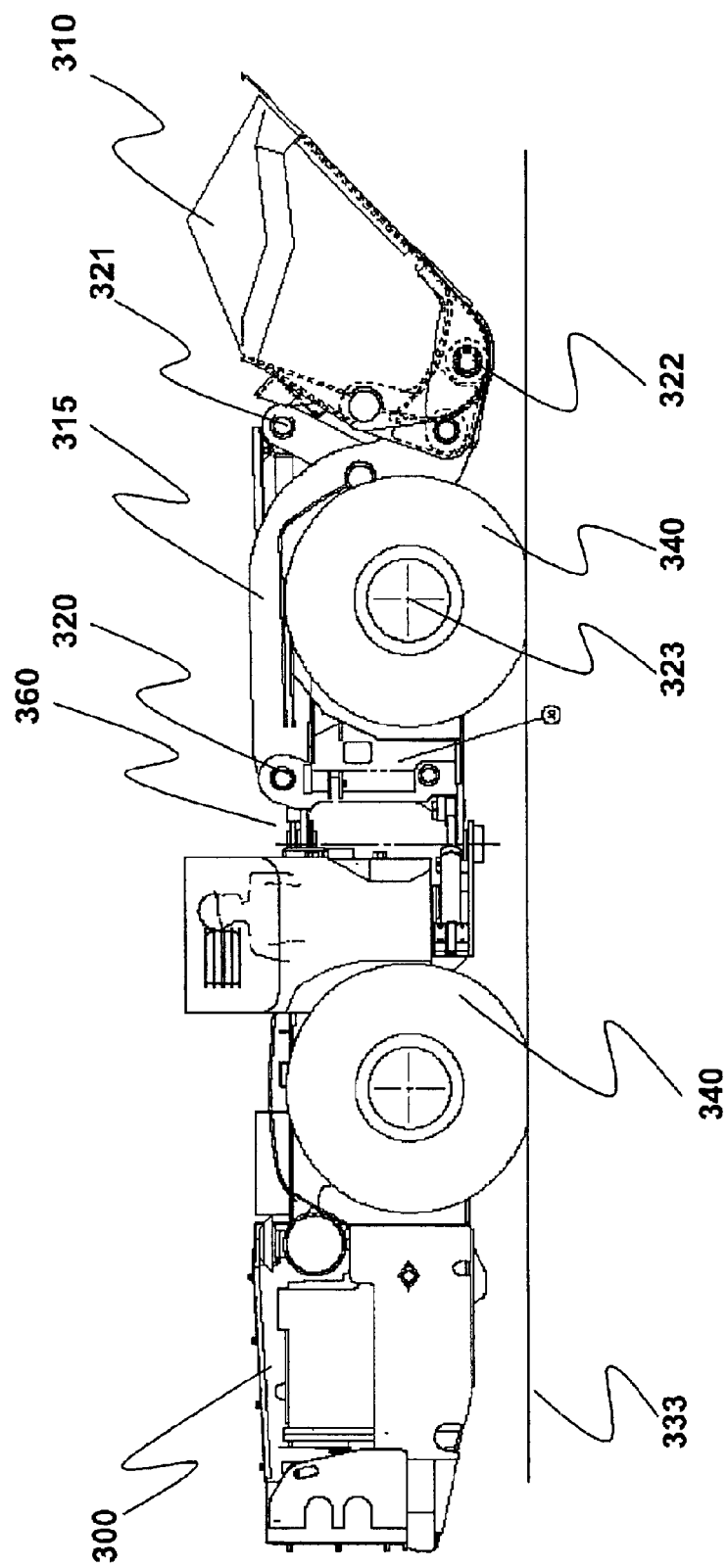
FIG. 3 illustrates an exemplary CAD model upon which one embodiment of the invention may be practiced.

FIG. 3 illustrates an exemplary CAD model upon which one embodiment of the invention may be practiced. Shown in FIG. 3, is a CAD model of a fully assembled machine 300. In particular, the machine 300 includes a bucket 310, a bucket arm 315 attached to the bucket 310 to manipulate the bucket 310, several centers of motion 320–323 about which the bucket 310 and the bucket arm 315 may pivot during motion of the bucket 310, the arm 315, and wheels 340. Additionally, a horizontal line 333 represents a level ground for the machine 300.

Various components of the machine 300 may be individual CAD models, where each of the CAD models resides in separate CAD files. In order to assemble the machine 300, each of the CAD models may be brought into an assembly CAD file, where each of the various components are assembled to one another. As previously described, assembling the machine 300 involves constraints inputted by the user. These constraints may include how the various components are to position and move relative to each other. The constraints of the machine 300 may be stored in the design database 106 of FIG. 1.

The constraints may include axial mating conditions. Axial mating conditions can designate that a component is to rotate relative to another component. As shown in FIG. 3, each of the centers of motion 320–323 may be associated with a location where the components are fit together utilizing assembly constraints 221–224 and motion constraints 231–235 (shown in FIG. 2B & 2C), i.e., pin joints 320, 321, and 322, and an axle 323.

Various aspects of the motion of the machine 300, in particular, the bucket 310 and its bucket arm 315 are information desired by an engineer. For instance, an engineer may use the information to determine forces generated in the machine 300 and it various components. These forces are often times related to geometries of motion of the machine 300. Geometries of motion help determine the direction and magnitudes of the forces in various components of the machine 300.

Shown in FIG. 3 is a side view of the machine 300. However, since the CAD model of the machine 300 is three dimensional, centers of motion may be determined for other planes of motion, such as, but not limited to, a side-to-side motion when viewed from the top. For instance, components of the machine 300 may allow it to turn and bend around corners causing side-to-side motion. The center of motion for the side-to-side motion in the illustrated embodiment of the machine 300 may be the pin joint 360.

Figure 4:
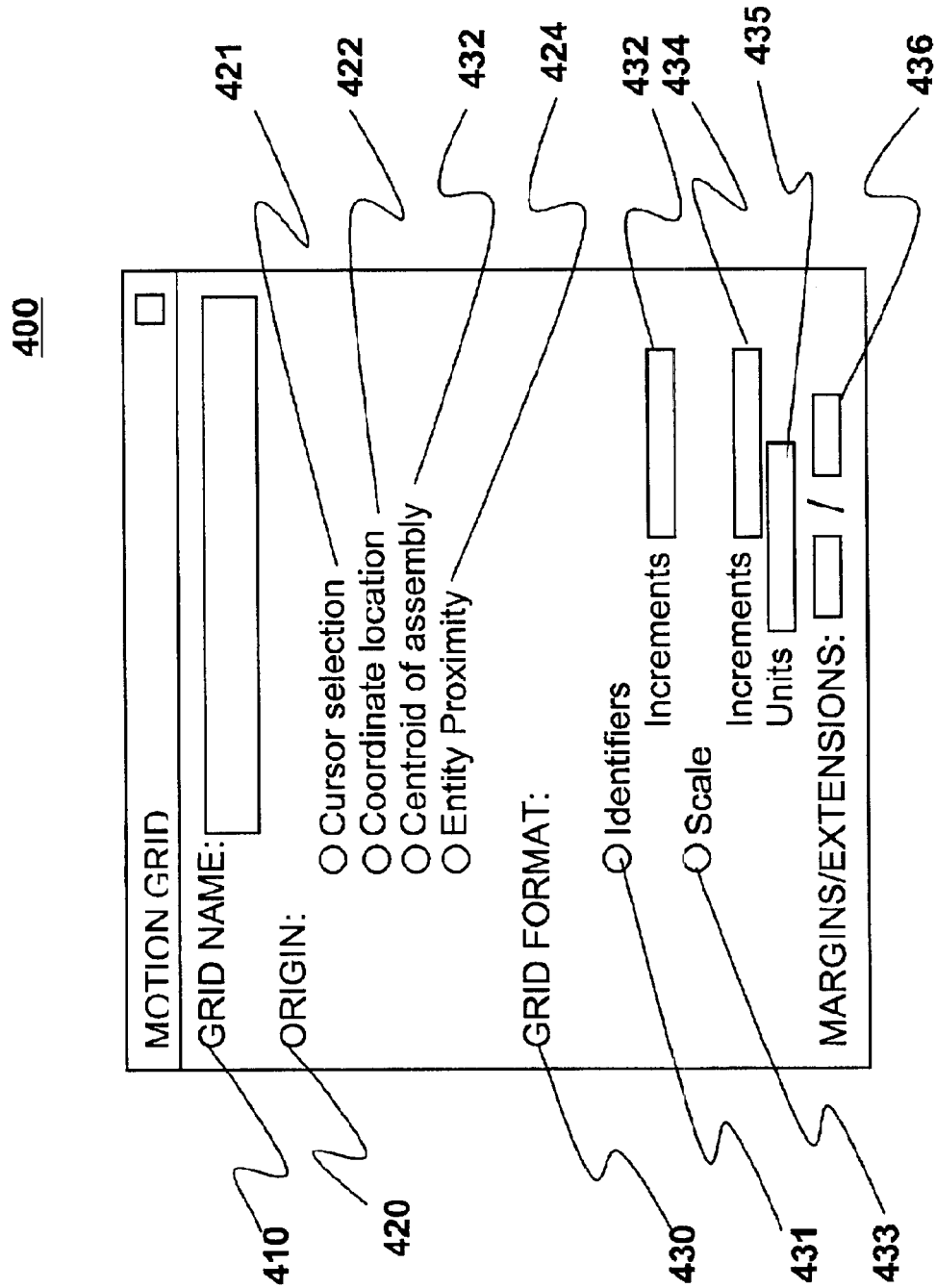
FIG. 4 illustrates an exemplary end user interface for facilitating automatic charting/graphing motion of CAD models, in accordance with one embodiment of the invention.

FIG. 4 illustrates an exemplary end user interface for facilitating automatic charting/graphing of motion of CAD models, in accordance with one embodiment of the invention. As shown in FIG. 4, a menu 400 is displayed for a user (not shown) to receive inputs for charting/graphing of the motion of the machine 300.

Shown in FIG. 4, grid menu 400 includes various inputs for displaying a grid pattern. One of the inputs shown is a text entry window for a grid name 410. The grid name 410 may be utilized to input various names for different aspects of motion of the machine 300, such as, but not limited to, motion of the bucket 310 relative to an arm pin joint center of motion 320. Various grid names may be stored in the design database 106 for different motions relative to different components, and subsequently retrieved for display at a later time.

Another input may be a placement of an origin 420 of a grid pattern that is, a location where the grid pattern may be zero. The origin input 420 includes various selections 421–424. Cursor location selection 421 allows a user to place an origin of a grid pattern at any location by placing a cursor in a location on the screen and cursor selecting. Coordinate location selection 422 allows a user to place an origin of a grid pattern at an inputted coordinate location, such as, but not limited to, an x-axis location and a y-axis location. Centroid of assembly selection 423 automatically generates and displays a grid pattern with its origin at a center of gravity of an assembly, i.e., center of gravity for the entire machine 300. Entity proximity selection 424 allows a user to place an origin of a grid pattern by placing a cursor close to a geometry piece and cursor selecting the area. The geometry piece closest to the cursor selection is automatically selected as the origin of the grid pattern. In alternate embodiments, any number of approaches can be used to identify an origin.

Another input may be a format 430 of a grid pattern, which includes the type of information a grid pattern displays, such as but not limited to, identifiers 431 and scales 433, i.e., identifying markers or numbered scales, respectively. The identifier selection 431 includes an increments input 432, where various intervals represented by a grid pattern may be inputted, such as, but not limited to, 2-meter increments. The scale selection 433 also includes an increments input 434, but also includes a selection for a type of scale 435, i.e., metric or English units.

As will be described in further detail later, the limits of the grid pattern need not be inputted because the motion determination engine 108 determines a range of motion for the CAD models. However, as shown in FIG. 4, the user may input margins/extensions criteria 436. The margins/extensions criteria 436 define the envelope within which a range of motion may be displayed. For example, if the user inputs one (1) unit as the margins and 1 unit for extensions criteria 436, a range of motion displayed within the grid pattern may be within 1 unit of the limits of the grid pattern, i.e., the range of motion may be within 1 unit and extend beyond by 1 unit.

Once the various inputs of the grid menu 400 are filled, the inputs are utilized to automatically generate and display a grid pattern to facilitate charting/graphing motion of CAD models, in accordance with the invention.

Figure 5A:
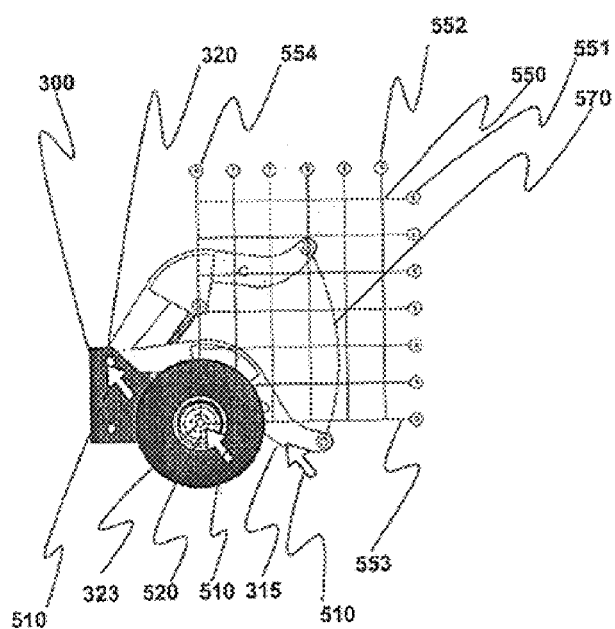
FIGS. 5A & 5B illustrate automatically generating and displaying a grid pattern at a selected center of motion based upon a range of motion, in accordance with one embodiment of the invention.
Figure 5B:
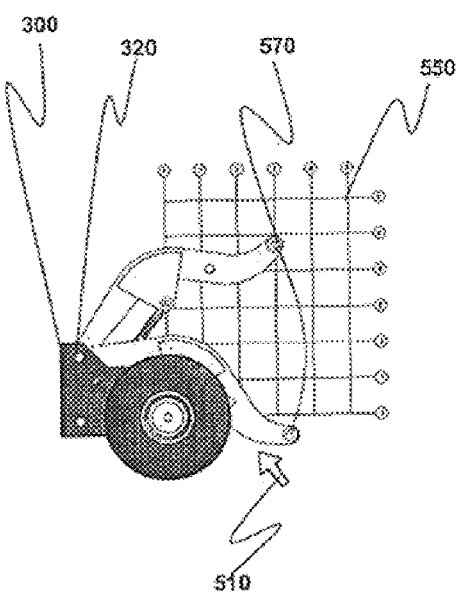

FIGS. 5A & 5B illustrate automatically generating and displaying a grid pattern at a selected center of motion based upon a range of motion, in accordance with one embodiment of the invention. For the embodiment shown in FIGS. 5A & 5B, the origin input 420 is selected as entity proximity 424 and the grid format 430 is identifiers 431 (shown in FIG. 4). The increments input 432 is selected as one (1) unit increments, and the margins/extensions input 436 is entered as one (1) unit. Additionally, the assembly of the machine 300 has been simplified to illustrate this one embodiment, i.e., certain other components of the machine 300 are not visible.

Shown in FIG. 5A, a selection of a center of motion, bucket arm pin joint 320, is received when a cursor 510 is utilized by a user (not shown) to select in proximity of the bucket arm pin joint 320. Additionally, a selection of a component, a bucket arm 315 of the machine 300, is received by another cursor selection. In response, motion determination engine 108 (shown in FIG. 1) determines a range of motion 570 of the bucket arm 315. The range of motion 570 may be determined from constraints associated with the bucket arm 315 about the bucket arm pin joint 320. The constraints associated with the bucket arm 315 may be pre-stored by the user, as previously described.

Once the range of motion 570 is determined, another cursor selection for the placement of an origin 520 of a grid pattern is received. As shown in FIG. 5A, the user utilizes the cursor 510 and cursor selects the wheel hub 323 by cursor selecting in proximity to the wheel hub 323. In response to the cursor selection for the placement of the origin 520, the motion determination engine 108 generates and displays a grid pattern 550. The range of motion 570 is automatically displayed on the grid pattern 550. Shown in FIGS. 5A & 5B. the generated and displayed grid pattern 570 has identifiers 551 in increments of one.

In FIG. 5A, the grid pattern 550 is generated and displayed based upon the range of motion 570, i.e., horizontal increments of 1 (0–5) 552 and vertical increments of 1 (0–6) 551. Because the origin 520 is selected as the wheel hub 323, the vertical baseline 554 and the horizontal baseline 553 (i.e., the zero line) of the grid pattern 550 intersect at the wheel hub 323, i.e., the origin 520.

Also shown in FIG. 5A, the range of motion 570 has a vertical margin of 1 unit at the top of the range 551, a horizontal margin of 1 unit at the right side of the range 552, and an extension of 1 unit beyond the horizontal baseline 553.

Referring now to FIG. 5B, in one embodiment, the user may cursor select the origin 520 of the grid pattern 550 and move it with a single cursor selection to a new location. As shown in FIG. 5B, the new location may be any location, such as, but not limited to, location visually behind the CAD model of the machine 300. In response, the grid pattern 550 is displayed in the new location without adjustments to the grid pattern 550.

In alternate embodiments, as the grid pattern is moved to new locations, the motion determination engine 108 adjusts the grid pattern 550 to ensure that the range of motion 570 is within its limits by generating and displaying an updated grid pattern for the new location. As previously alluded to, the range of motion 570 may extend beyond the limits of the grid pattern 550 if the user selects to allow for extensions, i.e., the user may establish new margins/extensions.

A Additionally, in one embodiment, if an alternate component (i.e., a different component) associated with the previously selected center of motion is selected, a range of motion for the alternate component is determined based upon the previously selected center of motion. The grid pattern is automatically adjusted to ensure that the range of motion for the alternate component is displayed within limits of the grid pattern.

In one embodiment, if the constraints for the assembly are modified, i.e., range of motion modified, here again, the motion analysis engine 108 adjusts the grid pattern to ensure that the displayed range of motion of the component is within limits of the grid pattern.

As shown in FIGS. 5A & 5B, the side profile of the CAD model is utilized to determine range of motion for generating and displaying a grid pattern. However, the range of motion of the CAD model may be in any view because the CAD model is a three dimensional model, as previously described. Additionally, more than a single grid pattern may be generated and displayed at any given time, and multiple grid patterns may be viewed in multiple views (i.e., planes, x-y, x-z, y-z, and so forth).

As a result, utilizing constraints associated with CAD models, charting/graphing of motion of CAD models is facilitated.

Figure 6:
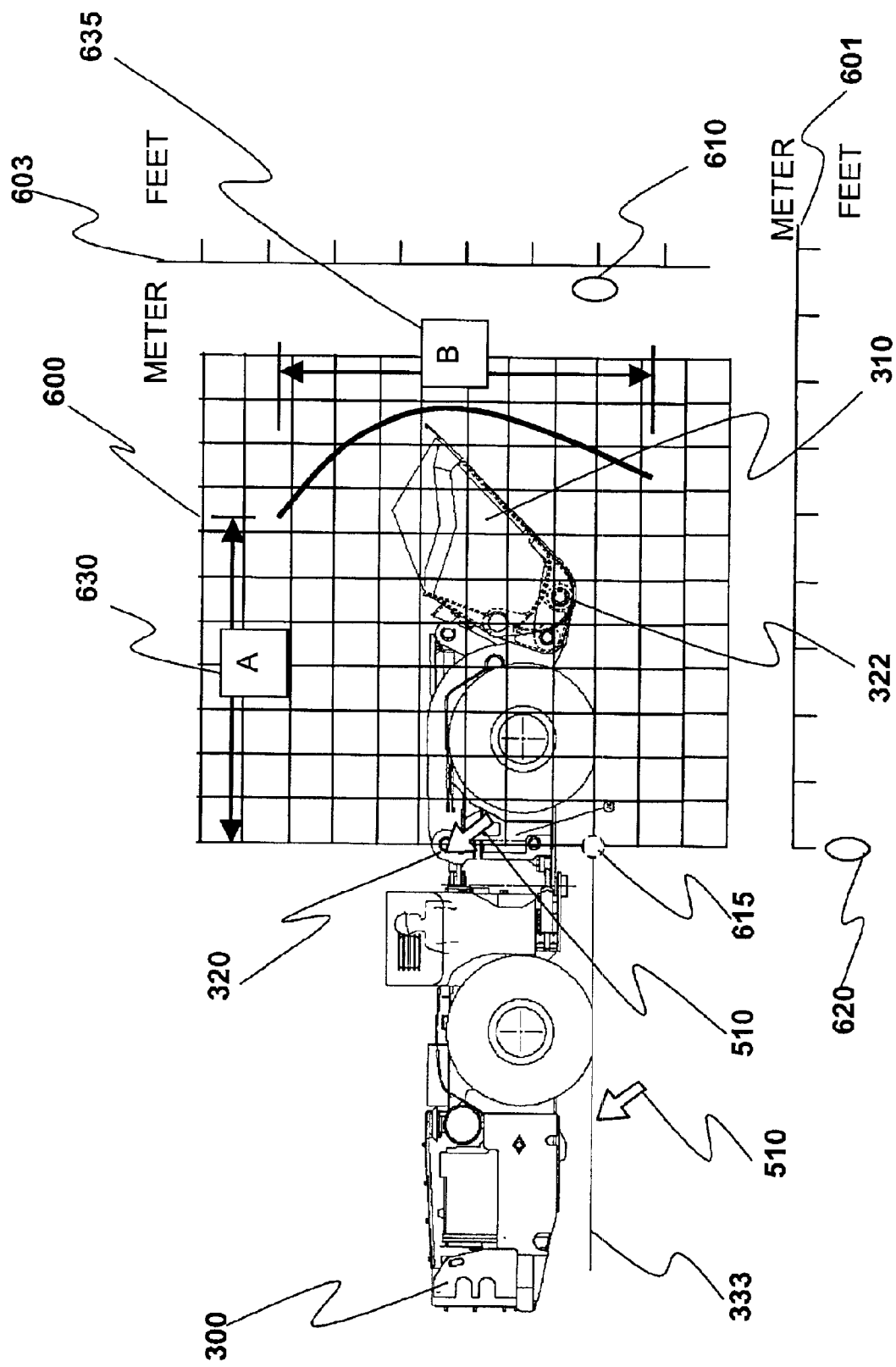
FIG. 6 illustrates adjustment of a grid pattern to ensure that the range of motion does not extend beyond the grid pattern, in accordance with one embodiment of the invention.

FIG. 6 illustrates adjustment of a grid pattern to ensure that the range of motion does not extend beyond the grid pattern, in accordance with one embodiment of the invention. Shown in FIG. 6 is a grid pattern 600 is generated and displayed as if the grid format input 430 was selected as scale 433 (shown in FIG. 4). Additionally, the scale input 433 may have the increments set as every one and a half meters (1.5) with units 435 of both metric and English. The margins/extensions input 436 may be 1 unit (i.e., 1.5 meter) for margins and zero (0) units for extensions (i.e., no extensions permitted beyond the limits of the grid pattern). Accordingly, the grid pattern 600 has a horizontal scale 601 and a vertical scale 603. The horizontal and vertical scales 601 & 603 may show two types of units, such as, but not limited to, meter and feet.

As can be seen in FIG. 6, the grid pattern 600 has a horizontal base line (i.e., a horizontal zero) 610 located part way up the grid pattern 600, while a vertical zero 620 is at an origin 615. The grid pattern 600 is the result of an adjustment of the grid pattern 600 to ensure that ranges of motion 630 & 635 are within the limits of the grid pattern 600. In FIG. 6, ranges of motion 630 & 635 of the bucket 310, in particular, the articulation of the bucket 310 about pin joint 322 is determined. Shown in FIG. 6, the articulation of the bucket 310 about the pin joint 322 has, for example, two components of motion, a horizontal component with a horizontal range 630, and a vertical component with a vertical range 635.

The two ranges of motion 630 & 635 may be determined from the constraints pre-stored for the bucket 310 about the pin joint 322. As previously described, constraints provide parameters for the motion of the components of the machine 300. Additionally, the horizontal range 630 and the vertical range 635 may be displayed with units describing the extent of the motion for each of the ranges of motion 630 & 635 along their respective scales 301 & 303.

In FIG. 6, the user, utilizing a cursor 510, has selected to establish the origin 420 as entity proximity 424 (shown in FIG. 4) with the entity selected as the level ground representation 333. Since the entity selected, the level ground representation 333, is effectively a horizontal line, the motion determination engine 108 may request another selection to establish a horizontal and vertical component of the origin. As shown in FIG. 5, the user has selected, again utilizing the cursor 510, the pin joint 320 resulting in the origin 615.

Shown in FIG. 6, the vertical range 635 extends beyond the horizontal base line 610, and as a result, the grid pattern 600 is extended beyond the base line 610 to ensure that the vertical range of motion 635 does not extend beyond the grid pattern 600. However, as previously illustrated in FIGS. 5A & 5B, the user may select to allow the range of motion to extend beyond the grid pattern 600.

Shown in FIG. 6, the side profile of the CAD model is utilized to determine the range of motion for a particular component of the assembly. However, as previously described, the range of the motion may be in any view because the assembly is a three dimensional CAD model. Additionally, more than a single grid pattern may be displayed at any given time, and multiple grid patterns may be viewed in multiple views (i.e., planes, x-y, x-z, y-z, and so forth).

In alternate embodiments, as the grid pattern is moved to new locations, the motion determination engine 108 adjusts the grid pattern 600 to ensure that the ranges of motion 630 & 635 are within predefined limits. As previously alluded to, the ranges of motion 630 & 635 may extend beyond the limits of the grid pattern 600 if the user selects to allow for extensions, i.e., the user may establish new margins/extensions.

As a result, automatic charting/graphing motion of CAD models is facilitated.

FIG. 7 illustrates exemplary engineering design information determined from the automatic charting/graphing of motion of CAD models practicing one embodiment of the invention. Shown in FIG. 7 is an exemplary table 700 has various engineering design information, which may be determined from automatic charting/graphing of motion on grid patterns, such as the grid patterns 550 & 600 (shown in FIGS. 5 & 6). The engineering design information of table 700 may be for an assembly, such as, but not limited to, the machine 300 of FIG. 3.

The table 700 may be automatically generated from ranges of motion automatically displayed on the grid patterns 550 & 600, in accordance with one embodiment of the invention. As shown in FIG. 7, engineering design information that may be determined from the grid patterns 550 & 600, may be motion information, such as, but not limited to, a range for digging distance 710, a range for digging reach 711, a range for level crowding distance 712, and a range for digging depth 713. Additionally shown in FIG. 7, engineering design information may also include force information, such as, but not limited to, crowding force 714 and breakout force 715. The motion information is utilized to determine the force information 714 & 715 because the force information may depend on the motion information, in particular, angles, which may be determined from the motion information automatically displayed on the grid patterns 550 & 600. Engineering design information 710–715 determined from the grid pattern 600 of FIG. 6 may be in units of the scales 601 & 603 displayed as part of the grid pattern 600. Even though the grid pattern 550 of FIG. 5 does not have scales (i.e., selected format is identifiers), engineering design information may still be determined using a default scaling unit corresponding to the file in which the assembly is contained.

As a result, automatic charting/graphing of motion of CAD models is facilitated. Additionally, from the automatic charting/graphing of motion, engineering design information may be determined.

Figure 8:
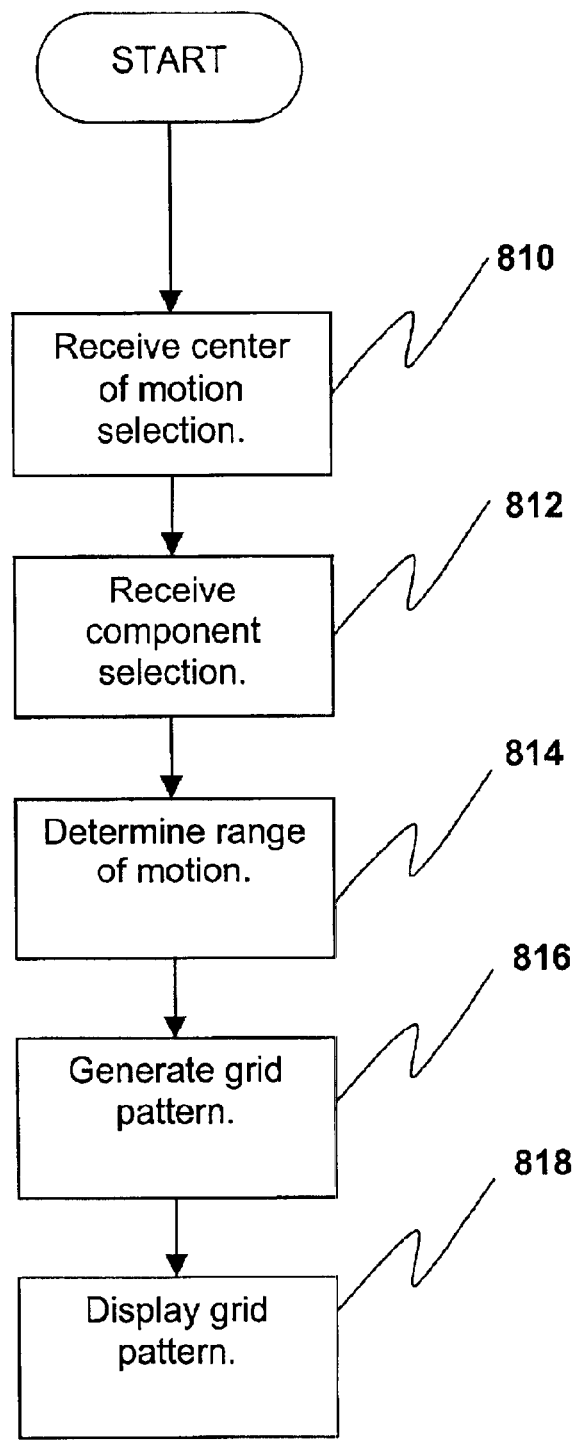
FIG. 8 illustrate the relevant operational flows of one embodiment of a motion analysis engine.

FIG. 8 illustrate the relevant operational flows of one embodiment of the motion analysis engine 108 of FIG. 1. For the illustrated embodiment, motion analysis engine 108 is programmed in an event driven model, i.e., motion analysis engine 108 is designed to be executed in a system environment where various event notification services are available from the operating system. One example of such an operating system suitable for practicing the invention is the Windows® operating systems, available from Microsoft Corporation of Redmond, Wash. In alternate embodiments, motion analysis engine 108 may be implemented in other programming approaches known in the art.

As shown in FIG. 8, a selection of a center of motion for an assembly of computer aided design (CAD) models of a mechanical design is received 810. Additionally, a selection of a component of the assembly associated with the selected center of motion is received 812. In response to receiving the center of motion and the component associated with the selected center of motion, the motion analysis engine 108 determines a range of motion for the component based upon the selected center of motion 814. As previously described, the range of motion may be determined by retrieving pre-stored constraints associated with various components of the assembly.

Furthermore, the motion analysis engine 108 receives a selection of an origin for a grid pattern, and in response the motion analysis engine 108 automatically generates the grid pattern based upon the determined range of motion 816. Once the grid pattern in generated, the motion analysis engine 108 automatically displays the grid pattern at the selected center of motion 818.

The received selections may be facilitated by a user utilizing a cursor to select the center of motion, the component, and the origin for the grid pattern.

As a result, automatic charting/graphing of motion of CAD models is facilitated.

Figure 9:
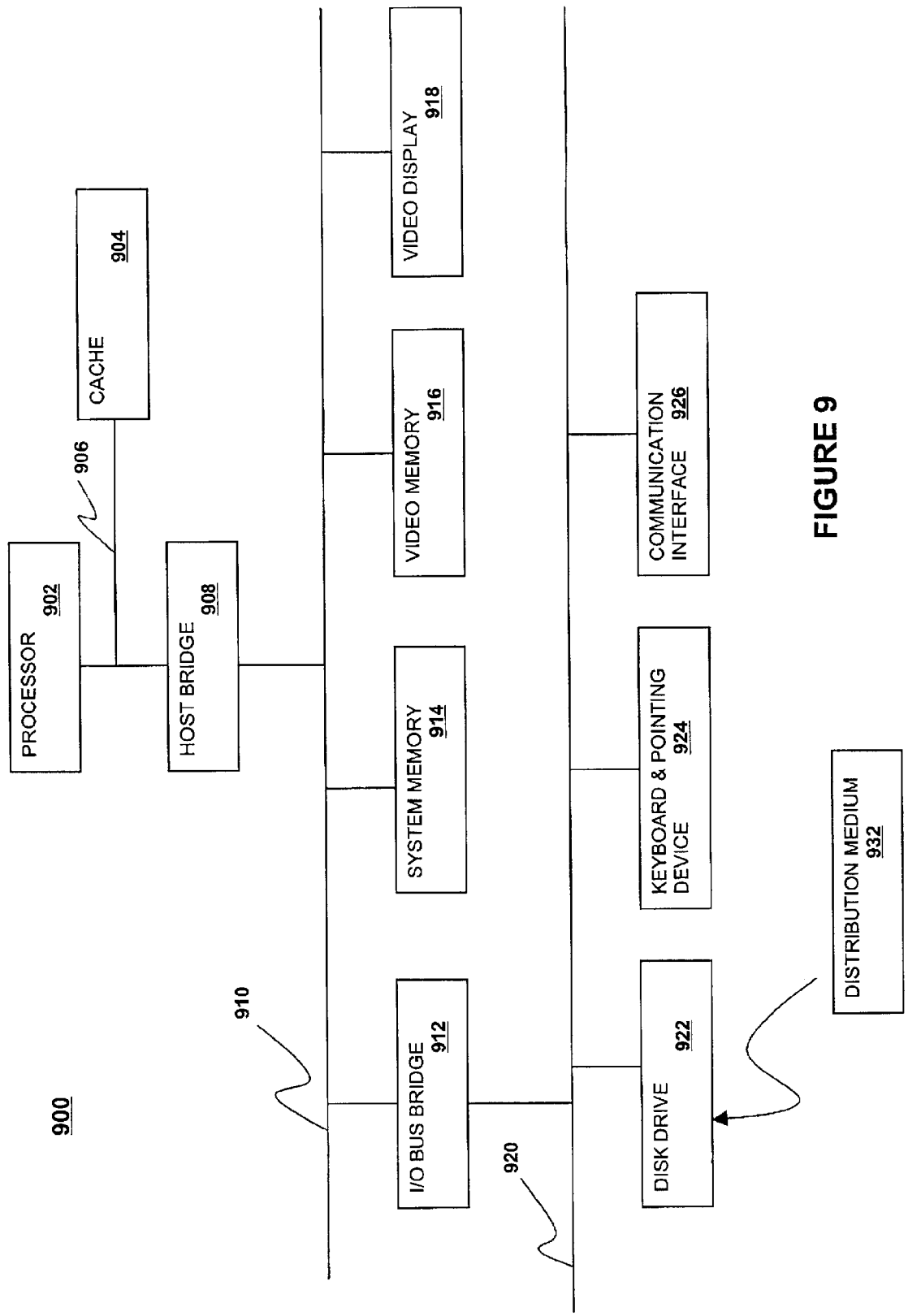
FIG. 9 illustrates one embodiment of a computer system suitable to be programmed with the mechanical design application of the invention.

FIG. 9 illustrates one embodiment of a computer system suitable to be programmed with the mechanical design application of the invention. As shown, for the illustrated embodiment, computer 900 includes processor 902, processor bus 906, high performance I/O bus 910 and standard I/O bus 920. Processor bus 906, and high performance I/O bus 910 are bridged by host bridge 908, whereas I/O buses 910 and 920 are bridged by I/O bus bridge 912. Coupled to processor bus 906 is cache 904. Coupled to high performance I/O bus 910 are system memory 914 and video memory 916, against which video display 918 is coupled. Coupled to standard I/O bus 920 are disk drive 922, keyboard and pointing device 924, and communication interface 926.

These elements perform their conventional functions known in the art. In particular, disk drive 922 and system memory 914 are used to store permanent and working copies of the mechanical design system incorporated with the teachings of the invention. The permanent copy may be pre-loaded into disk drive 922 in factory, loaded from distribution medium 932, or down loaded from a remote distribution source (not shown). Distribution medium 932 may be a tape, a CD, and DVD or other storage medium of the like. The constitutions of these elements are known. Any one of a number implementations of these elements known in the art may be used to form computer system 900.

In general, those skilled in the art will recognize that the invention is not limited by the details described. Instead, the invention can be practiced with modifications and alterations within the spirit and scope of the appended claims. The description is thus to be regarded as illustrative instead of restrictive on the invention.

Thus, an improved way for automatically charting/graphing motion of CAD models is facilitated.

What is claimed is:

1. A computer implemented method comprising:
   receiving an assembly of components, where a first component moves relative to a second component;
   receiving a selection of a center of motion for the first component;
   receiving a selection of the first component of the assembly associated with the selected center of motion, where the motion of the first component relative to the second component is defined by reference to the center of motion;
   determining a range of motion for the first component;
   receiving a selection of an origin for a grid pattern;
   automatically generating the grid pattern based upon the determined range of motion; and
   automatically displaying the grid pattern at the selected origin.

2. The method of claim 1 further comprising:
   determining if the range of motion associated with the first component has been modified; and
   adjusting the grid pattern to ensure that the displayed range of motion of the first component is within limits of the grid pattern.

3. The method of claim 1 further comprising:
   receiving an indication of a change in location of the origin of the grid pattern to a new location; and
   displaying a grid pattern with its origin at the new location.

4. The method of claim 1 further comprising:
   receiving a selection of an alternate component associated with the selected center of motion;
   determining a range of motion for the alternate component based upon the selected center of motion; and
   automatically adjusting the grid pattern to ensure that the range of motion for the alternate component is displayed within limits of the grid pattern.

5. The method of claim 1, wherein receiving the selection of the origin of comprises receiving at least one of a cursor selection, coordinate location, centroid of the geometry piece, or an entity proximity.

6. The method of claim 1, wherein determining the range of motion comprises retrieving pre-stored constraints for the component.

7. The method of claim 1, wherein automatically generating comprises automatically generating a grid pattern based at least upon one or more user inputs.

8. The method of claim 1, wherein automatically displaying comprises displaying a grid pattern covering one or more ranges of motion.

9. The method of claim 1, wherein automatically displaying comprises displaying at least one of a scale or an indicator.

10. The method of claim 1 further comprising determining engineering design information based at least upon the determined range of motion.

11. A computer implemented method comprising:
    receiving an assembly of components, where a component moves relative to one or more other components;
    receiving a selection of the component, where the component is associated with one or more constraints that define a relationship of the component to at least one of the one or more other components of the assembly;
    determining a range of motion for the component based on the one or more constraints; and
    automatically displaying a grid pattern based upon the determined range of motion for the component.

12. The method of claim 11, wherein the receiving a selection of a component step comprises receiving a selection of a component associated with a center of motion of the component.

13. The method of claim 11, wherein automatically displaying comprises automatically displaying a grid pattern at a received selection of an origin for the grid pattern.

14. A computer program product, tangibly stored on a computer-readable medium, comprising instructions operable to cause a programmable processor to:
    receive an assembly of components, where a first component moves relative to a second component;
    receive a selection of a center of motion for the first component;
    receive a selection of the first component of the assembly associated with the selected center of motion, where the motion of the first component relative to the second component is defined by reference to the center of motion;
    determine a range of motion for the first component;
    receive a selection of an origin for a grid pattern;
    automatically generate the grid pattern based upon the determined range of motion; and
    automatically display the grid pattern at the selected origin.

15. The computer program product of claim 14, wherein the instructions are further operable to determine if the range of motion associated with the first component has been modified, and adjust the grid pattern to ensure that the displayed range of motion of the first component is within limits of the grid pattern.

16. The computer program product of claim 14, wherein the instructions are further operable to receive an indication of a change in location of the origin of the grid pattern to a new location, and display a grid pattern with its origin at the new location.

17. The computer program product of claim 14, wherein the instructions are further operable to receive a selection of an alternate component associated with the selected center of motion, determine a range of motion for the alternate component based upon the selected center of motion, and automatically adjust the grid pattern to ensure that the range of motion for the alternate component is displayed within limits of the grid pattern.

18. The computer program product of claim 14, wherein the instructions are further operable to receive at least one of a cursor selection, coordinate location, centroid of the geometry piece, or an entity proximity.

19. The computer program product of claim 14, wherein the instructions are further operable to retrieve pre-stored constraints for the component.

20. The computer program product of claim 14, wherein the instructions are further operable to automatically generate a grid pattern based at least upon one or more user inputs.

21. The computer program product of claim 14, wherein the instructions are further operable to display a grid pattern covering one or more ranges of motion.

22. The computer program product of claim 14, wherein the instructions are further operable to display at least one of a scale or an indicator.

23. The computer program product of claim 14, wherein the instructions are further operable to further determine engineering design information based at least upon the determined range of motion.

24. A computer program product, tangibly stored on a computer-readable medium, comprising instructions operable to cause a programmable processor to:
receive an assembly of components, where a component moves relative to one or more other components;
receive a selection of the component, where the component is associated with one or more constraints that define a relationship of the component to at least one of the one or more other components of the assembly;
determine a range of motion for the component based on the one or more constraints; and
automatically display a grid pattern based upon the determined range of motion for the component.

25. The computer program product of claim 24, wherein the instructions operable to receive a selection of a component are operable to receive a selection of a component associated with a center of motion of the component.

26. The computer program produce of claim 24, wherein the instructions are further operable to automatically display a grid pattern at a received selection of an origin for the grid pattern.

27. An apparatus comprising:
a processor; and
a computer program product, tangibly stored on a computer-readable medium, comprising instructions operable to cause a programmable processor to:
receive an assembly of components, where a first component moves relative to a second component;
receive a selection of a center of motion for the first component;
receive a selection of the first component of the assembly associated with the selected center of motion, where the motion of the first component relative to the second component is defined by reference to the center of motion;
determine a range of motion for the first component;
receive a selection of an origin for a grid pattern;
automatically generate the grid pattern based upon the determined range of motion; and
automatically display the grid pattern at the selected origin.

28. An apparatus comprising:
a processor; and
a computer program product, tangibly stored on a computer-readable medium, comprising instructions operable to cause a programmable processor to:
receive an assembly of components, where a component moves relative to one or more other components;
receive a selection of the component, where the component is associated with one or more constraints that define a position of the component relative to one or more other components of the assembly;
determine a range of motion for the component based on the one or more constraints; and
automatically displays a grid pattern based upon the determined range of motion for the component.

29. The method of claim 1, wherein:
the first component is associated with one or more constraints that define a position of the first component relative to the second component; and
the determining a range of motion step comprises determining a range of motion based on the one or more constraints.

30. The computer program product of claim 14, wherein:
the first component is associated with one or more constraints that define a position of the first component relative to the second component; and
instructions operable to determine a range of motion step comprises instructions operable to determine a range of motion based on the one or more constraints.

31. The computer program product of the apparatus of claim 27, wherein:
the first component is associated with one or more constraints that define a position of the first component relative to the second component; and
instructions operable to determine a range of motion step comprises instructions operable to determine a range of motion based on the one or more constraints.

32. The method of claim 11, wherein the one or more constraints include at least one constraint defining a position of the component relative to at least one of the one or more other components of the assembly.

33. The method of claim 11, wherein the one or more constraints include at least one constraint defining motion of the component relative to at least one of the one or more other components of the assembly.

34. The computer program product of claim 24, wherein the one or more constraints include at least one constraint defining a position of the component relative to at least one of the one or more other components of the assembly.

35. The computer program product of the apparatus of claim 28, wherein the one or more constraints include at least one constraint defining a position of the component relative to at least one of the one or more other components of the assembly.

* * * * *